US012027598B2

(12) United States Patent
Wu et al.

(10) Patent No.: US 12,027,598 B2
(45) Date of Patent: Jul. 2, 2024

(54) BURIED PAD FOR USE WITH GATE-ALL-AROUND DEVICE

(71) Applicant: Taiwan Semiconductor Manufacturing Company Ltd., Hsinchu (TW)

(72) Inventors: Guo-Huei Wu, Tainan (TW); Pochun Wang, Hsinchu (TW); Chih-Liang Chen, Hsinchu (TW); Li-Chun Tien, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 187 days.

(21) Appl. No.: 17/331,356

(22) Filed: May 26, 2021

(65) Prior Publication Data
US 2022/0384598 A1 Dec. 1, 2022

(51) Int. Cl.
*H01L 29/423* (2006.01)
*H01L 29/06* (2006.01)
(52) U.S. Cl.
CPC .... *H01L 29/42392* (2013.01); *H01L 29/0649* (2013.01); *H01L 29/0673* (2013.01)
(58) Field of Classification Search
CPC ....... H01L 29/42392; H01L 2029/7858; H01L 29/1033; H01L 24/08; H01L 21/823475; H01L 29/0649; H01L 29/0673; H01L 21/823431; H01L 27/0886; H01L 21/823481; H01L 29/78696; H01L 29/775; H01L 29/66439
See application file for complete search history.

(56) References Cited

U.S. PATENT DOCUMENTS

| | | | |
|---|---|---|---|
| 2016/0268382 A1* | 9/2016 | Colinge | H01L 21/76895 |
| 2017/0243782 A1* | 8/2017 | Wu | H01L 21/308 |
| 2018/0323174 A1* | 11/2018 | Mueller | H01L 24/08 |
| 2019/0172828 A1* | 6/2019 | Smith | H01L 21/823842 |
| 2021/0028169 A1* | 1/2021 | Smith | H01L 27/092 |

\* cited by examiner

*Primary Examiner* — Changhyun Yi
(74) *Attorney, Agent, or Firm* — FOLEY & LARDNER LLP

(57) ABSTRACT

A semiconductor structure includes an isolation structure formed on a substrate, a gate-all-around transistor structure formed on the isolation structure, a via electrically coupled to a gate terminal of the gate-all-around transistor structure, and a buried conductive pad formed within the isolation structure and electrically coupled to the via. The buried conductive pad can extend through the isolation structure in two dimensions, such as in both a vertical dimension and a horizontal dimension. The semiconductor structure can provide advantages in terms of routing flexibility, among other possible advantages.

20 Claims, 12 Drawing Sheets

BURIED PAD FOR USE WITH GATE-ALL-AROUND DEVICE

BACKGROUND

The present disclosure generally relates to semiconductor devices and methods for fabricating semiconductor devices, and particularly to designing layouts of circuits that include semiconductor devices. As feature size of semiconductor devices continues to decrease, constraints with respect to use of space in circuit layouts generally arise. Semiconductor devices are used in a wide variety of electronics, and improvements regarding both production and performance of semiconductor devices are generally desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
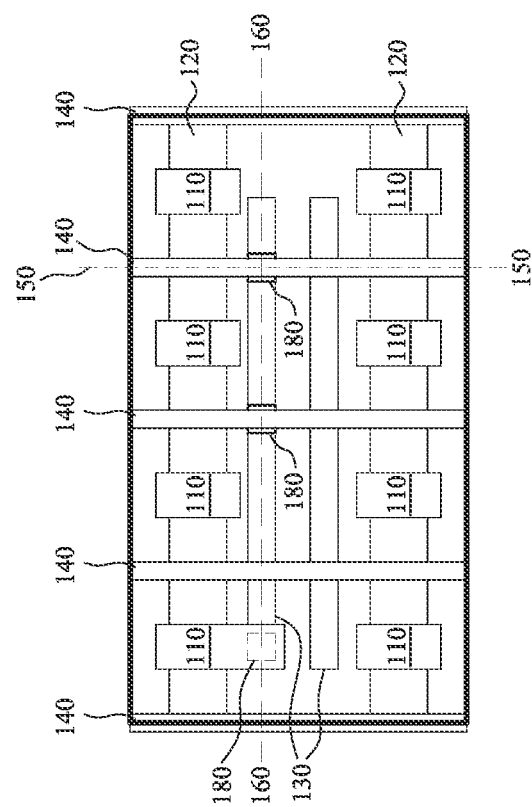
FIG. 1A illustrates a top view of an example semiconductor structure, in accordance with some embodiments.
Figure 1A:

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor structure such as implemented in an integrated circuit. The semiconductor structure includes a gate-all-around transistor structure that is electrically coupled to a buried conductive pad formed within an isolation structure using a via. The formation of the buried conductive pad within the isolation structure, such as a shallow trench isolation structure formed on a substrate, can provide advantages in terms of routing flexibility when designing a circuit layout.

Referring now to FIG. 1A, a top view of an example semiconductor structure 100 is shown, in accordance with some embodiments. Semiconductor structure 100 generally includes a plurality of gate-all around transistor structures, such as gate-all-around field-effect transistor (GAAFET) structures. These structures are sometimes referred to as surrounding-gate transistor (SGT) structures. The gate-all around transistor structures can generally allow for formation of smaller transistor structures and therefore smaller and more compact integrated circuits when compared to some alternative approaches such as fin field-effect transistor (FinFET) structures. The gate-all around transistor structures are formed on an isolation structure, and the isolation structure is formed on a substrate.

Semiconductor structure 100 is shown to include a plurality of epitaxial regions 110. As illustrated in FIG. 1A, epitaxial regions 110 are formed at evenly or about evenly spaced distances in a horizontal direction (from the top shown in FIG. 1A) along semiconductor structure 100. Epitaxial regions 110 each serve as a source or drain terminals for one or more gate-all around transistor structures. Epitaxial regions 110 are generally crystalline structures that can be formed using epitaxial growth processes such as chemical vapor deposition (CVD), vapor-phase epitaxy (VPE), molecular-beam epitaxy (MBE), liquid-phase epitaxy (LPE), and other suitable processes and combinations thereof. Epitaxial regions 110 can be doped using suitable dopants, including both n-type and p-type dopants.

Semiconductor structure 100 is also shown to include a plurality of channel structures 120. Channel structures 120 can be implemented using nanowires or nanosheets. For example, each channel structure 120 can be implemented using three (or more or less) nanosheets formed using a semiconductor material such as indium gallium arsenide (InGaAs). Other suitable semiconductor materials can also be used to form the nanosheets. Likewise, each channel structure 120 can be implemented using three (or more or less) nanowires formed using a semiconductor material such as indium gallium arsenide among other suitable semiconductor materials. Nanosheets generally have a more flat geometrical profile, whereas nanowires generally have a more round geometrical profile. It will be appreciated that channel structures 120 can also be implemented using other suitable structures in addition to nanosheets and nanowires. As illustrated in the top view of FIG. 1A, epitaxial regions 110 are formed on channel structures 120. Channel structures 120 are generally formed on an isolation structure 170 of semiconductor structure 100 as discussed in more detail below.

Semiconductor structure 100 is also shown to include a plurality of gate structures 140. Gate structures 140 can be implemented as polysilicon or metal gate structures, for example. Each of the gate structures 140 is formed around a respective portion of each channel structure 120 in order to form individual gate-all around transistor structures along with corresponding epitaxial regions 110. Gate structures 140 can be formed using a variety of suitable processes, including chemical vapor deposition (CVD) and other suitable processes and combinations thereof. While not explicitly illustrated in FIG. 1A, it will be appreciated that additional layers including spacers for electrically isolating gate structures 140 and other suitable insulating layers, for example, can be formed during the fabrication process of semiconductor structure 100. As illustrated in FIG. 1A, gate structures 140 are generally disposed perpendicular to channel structures 120.

Semiconductor structure 100 is also shown to include a plurality of buried (or backside) conductive pads 130, as discussed in further detail below, and two cross sections: a cross section 150 and a cross section 160. Cross section 150 is cut in a vertical direction (from the top view shown in FIG. 1A) running along one of the gate structures 140, and cross section 160 is cut in a horizontal direction (from the top view shown in FIG. 1A) running along one of the buried conductive pads 130. Buried conductive pads 130 are generally formed of conductive material such as copper, aluminum, tungsten, cobalt, or other suitable conductive materials and combinations thereof. Buried conductive pads 130 generally provide routing of electrical signals within semiconductor structure 100, e.g., on a backside of the semiconductor structure 100.

Figure 1B:
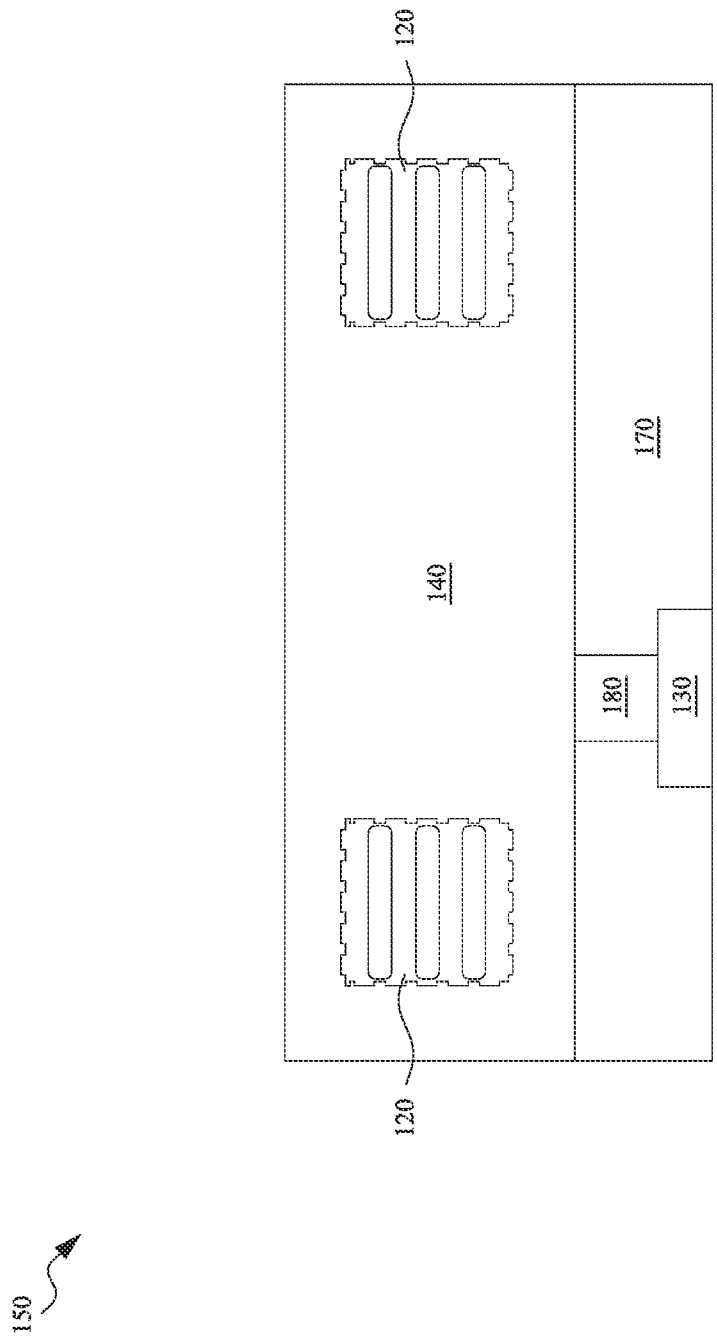
FIG. 1B illustrates a cross section of the semiconductor structure of FIG. 1A, in accordance with some embodiments.

Referring now to FIG. 1B, a cross section of a semiconductor structure 100 cut from cross section 150 illustrated in FIG. 1A is shown, in accordance with some embodiments. In the cross section of FIG. 1B, an isolation structure 170 can be seen, which may be formed on the backside of a substrate of semiconductor structure 100 (not shown). The substrate can be implemented as bulk silicon substrate, a silicon-insulator-silicon substrate, a silicon-on-sapphire substrate, and other types of substrates. Isolation structure 170 can be implemented as a shallow trench isolation (STI) structure or an interlayer dielectric (ILD) structure, and can be formed by creating trenches within the substrate, filling the trenches with insulating material (e.g. dielectric material such as silicon dioxide), and removing excess insulating material using processes such as chemical-mechanical polishing (CMP).

Also shown in FIG. 1B is a via 180 that is used to electrically couple the illustrated gate structure 140 and the illustrated buried conductive pad 130. Via 180 an be implemented using a variety of different materials and structures, such as copper, aluminum, tungsten, cobalt, and other suitable metal materials, or combinations thereof. Via 180 can be seen from the top view shown in FIG. 1A, for reference. As illustrated in FIG. 1B, both via 180 and buried conductive pad 130 are formed within isolation structure 170. Also illustrated in FIG. 1B are cross sections of channel structures 120, wherein in the embodiment illustrated in FIG. 1B channel structures 120 are implemented using nanosheets. It can be seen in FIG. 1B that the illustrated gate structure 140 surrounds the nanosheets in order to form gate-all around transistor structures. As illustrated in the example of FIG. 1B, the nanosheets are thin sheets of silicon surrounded by a thin layer of oxide. It will be appreciated that channel structures 120 can be implemented in a variety of different manners, however.

Figure 1C:
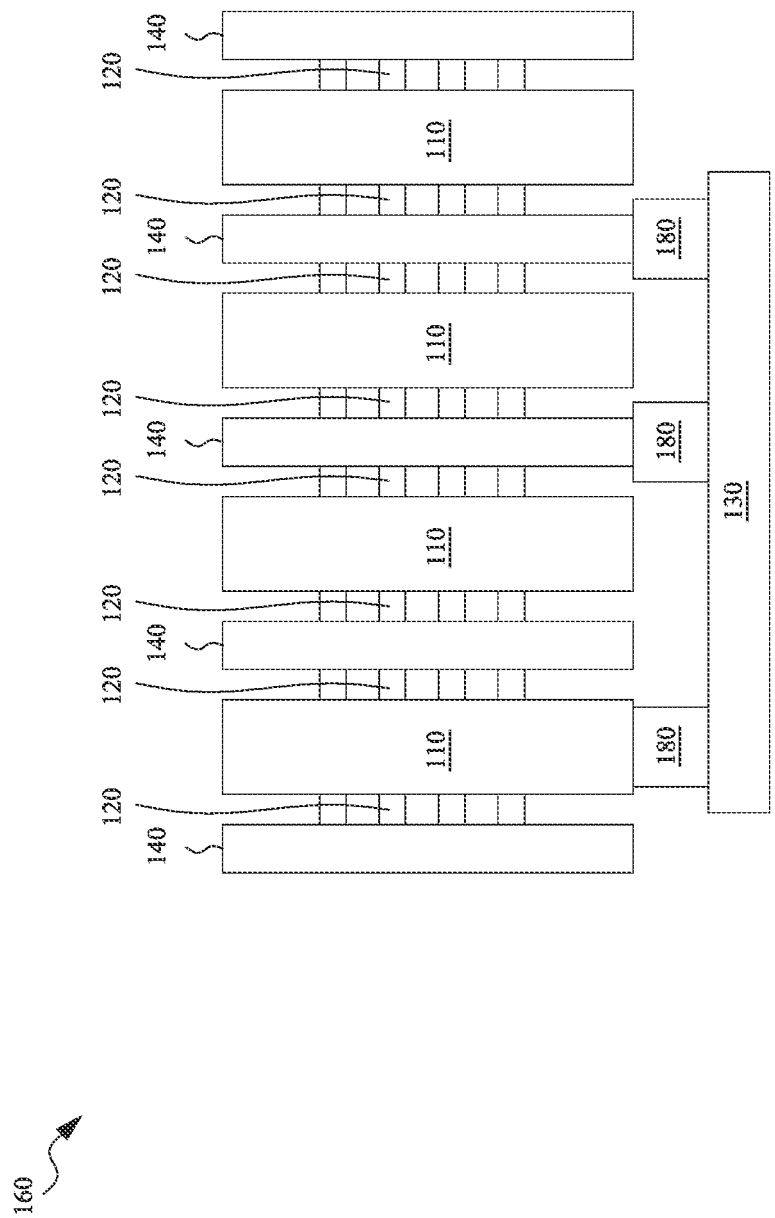
FIG. 1C illustrates another cross section of the semiconductor structure of FIG. 1A, in accordance with some embodiments.

Referring now to FIG. 1C, another cross section of a semiconductor structure 100 cut from cross section 160 illustrated in FIG. 1A is shown, in accordance with some embodiments. In the cross section of FIG. 1C, a plurality of different vias 180 formed within semiconductor structure 100 can be seen. The plurality of vias 180 include a first via that is electrically coupled to a gate terminal of a first gate-all around transistor structure, a second via that is electrically coupled to a gate terminal of a second gate-all around transistor structure, and a third via that is electrically coupled to an epitaxial region (source terminal, drain terminal) of a third gate-all around transistor structure. Each of the illustrated vias 180 are also electrically coupled to the illustrated buried conductive pad 130. In various embodiments, gate structures 140 are each formed to wrap around each of channel structures 120 (as shown in FIG. 1B), and epitaxial regions 110 are each formed one side of each gate structure 140 (as shown in FIGS. 1A and 1C).

Figure 2:
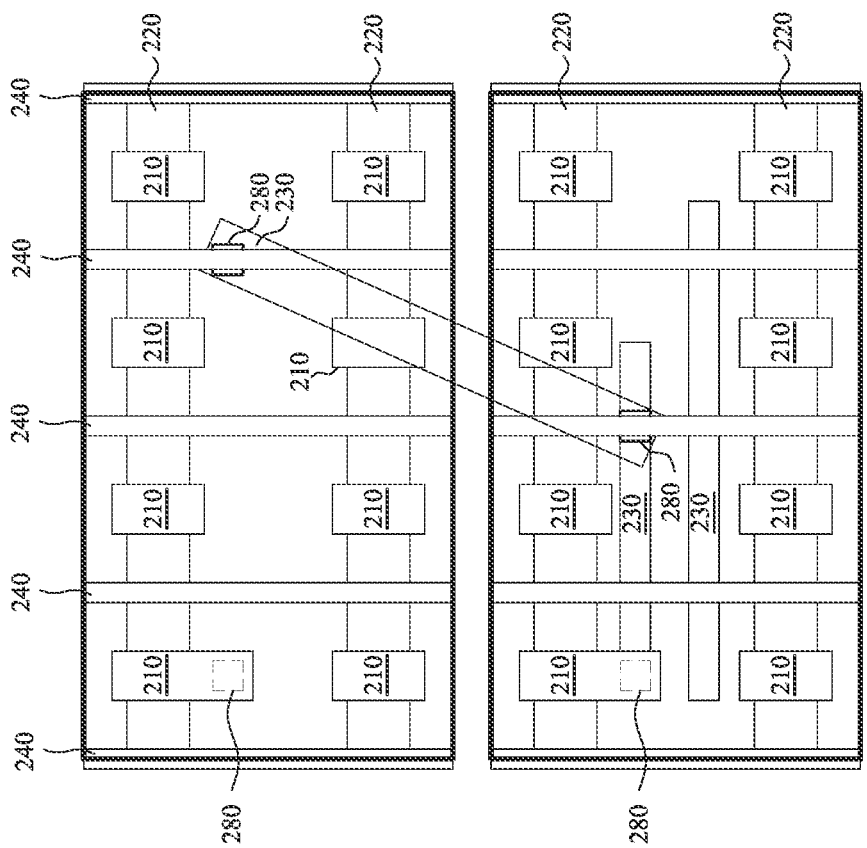
FIG. 2 illustrates a top view of another example semiconductor structure, in accordance with some embodiments.

Referring now to FIG. 2, a top view of another example semiconductor structure 200 is shown, in accordance with some embodiments. Semiconductor structure 200 is similar to semiconductor 100 in that it includes a plurality of epitaxial regions 210, a plurality of channel structures 220, a plurality of buried conductive pads 230, a plurality of gate structures 240, and a plurality of vias 280. These structures are similar to epitaxial regions 110, channel structure 120, buried conductive pads 130, gate structures 140, and vias 180 of semiconductor structure 100, respectively, and thus the discussions are no repeated. However, as illustrated in FIG. 2, buried conductive pads 230 can run in two dimensions within an isolation structure of semiconductor structure 200 (similar to isolation structure 170 discussed above). For example, two of the buried conductive pads 230 run along the channel structures 220, and one of the buried conductive pads 230 runs along a direction tilted from the horizontal channel structures 220 and vertical gate structures 240. In particular, such a tilted buried conductive pad 230 can extend across respective projections of one or more of the channel structures 220.

Since channel structures 220 are formed on the isolation structure of semiconductor structure 200 and not within the isolation structure, added routing flexibility can be achieved for buried conductive pads 230. Since there are no fins (e.g. of a FinFET device) present within the isolation structure, buried conductive pads 230 can be formed in multiple directions within the isolation structure without any concern of running into the fins. Various possibilities for forming buried conductive pads 230 that extend in two dimensions within semiconductor structure 200, some of which are contemplated below with respect to example circuit layouts 300, 400, and 500. Moreover, due to this routing flexibility, circuit layouts with reduced area requirements for buried conductive pads 230 can be implemented since buried conductive pads 230 will not run into fins or other obstacles within the isolation structure.

Figure 3A:
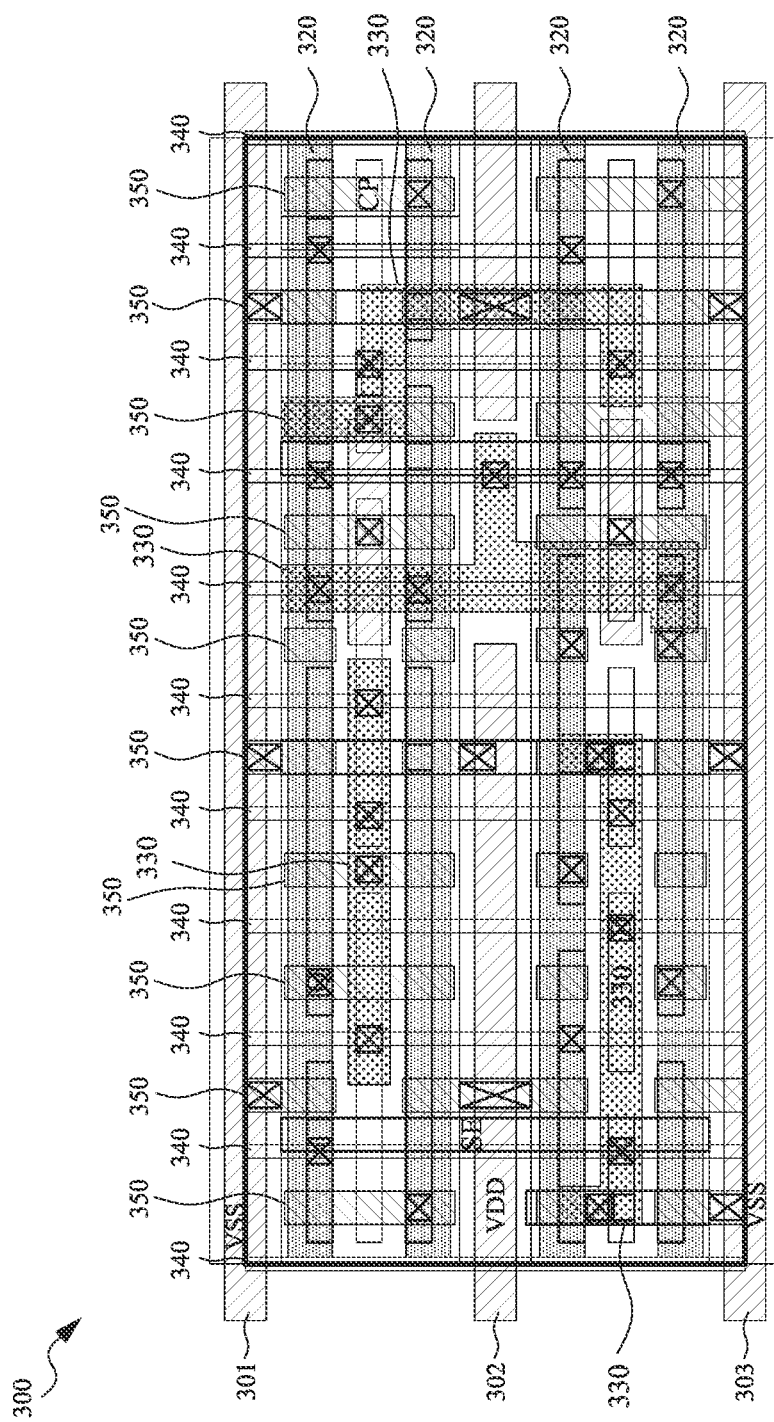
FIG. 3A illustrates a top view of an example circuit layout, in accordance with some embodiments.

Referring now to FIG. 3A, a top view of an example circuit layout 300 is shown, in accordance with some embodiments. Circuit layout 300 may correspond to a scan D-flip flop, or a D-flip flop with a scan input, which is not shown here for purposes of clarity. Circuit layout 300 is similar to semiconductor structure 100 and semiconductor structure 200 in the sense that it includes a plurality of gate-all around transistor structures formed on an isolation structure, and a plurality of buried conductive pads formed within the isolation structure. The buried conductive pads can extend in two dimensions, thereby providing enhanced routing flexibility and the ability to reduce the overall area requirements for circuit layout 300.

In FIG. 3A, a plurality of channel structures 320 and a plurality of gate structures 340 are shown. These structures are similar to channel structures 120 and channel structures 220, and gate structures 140 and gate structures 240 discussed above. Circuit layout 300 is also shown to include a plurality of epitaxial regions 350 formed around channel structures 320, similar to epitaxial regions 110 and epitaxial regions 210 discussed above. Also shown in FIG. 3A is a plurality of buried conductive pads 330 that are electrically coupled to various gate-all around transistor structures of circuit layout 300. Buried conductive pads 330 are similar to buried conductive pads 130 and buried conductive pads 230 discussed above, i.e., formed on the backside of a substrate to realize the circuit layout 300. Circuit layout 300 provides an example implementation of the two-dimensional buried conductive pads as described in the present disclosure. Through the use of such buried conductive pads, the central poly pitch of circuit layout 300 can be reduced (when compared to an existing layout that implements FinFET structures). This is because the disclosed buried conductive pads can be more flexibly formed across or between the channel structures that adopt the GAAFET structures, which results in less area needed (e.g., reduced by at least 9%). Also shown in FIG. 3A is a first power rail 301, a second power rail 303, and a ground rail 302. Such power rails are formed on the backside of the substrate, in some embodiments.

Figure 3B:
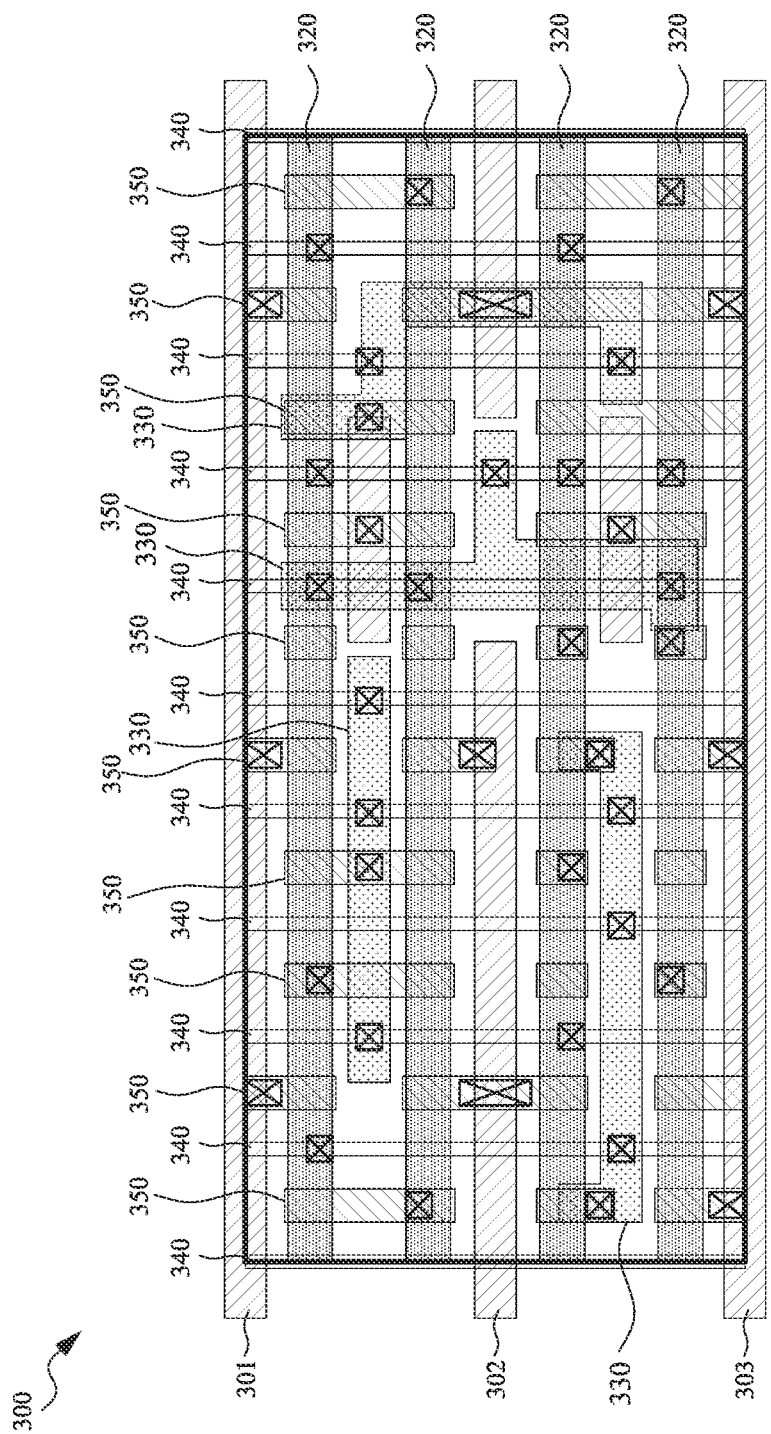
FIG. 3B illustrates a bottom view of the example circuit layout of FIG. 3A, in accordance with some embodiments.

Referring now to FIG. 3B, a bottom view of circuit layout 300 is shown, in accordance with some embodiments. In FIG. 3B, channel structures 320 can be seen as well as gate structures 340. Further, power rail 301, power rail 303, and ground rail 302 can also be seen, along with buried conductive pads 330. FIG. 3B provides another view of buried conductive pads 330 in order to illustrate the two-dimensional characteristics of buried pads 330. As seen in FIG. 3B, buried conductive pads 330 extend not only in the x-dimension, but they also extend in the y-dimension.

Figure 4A:
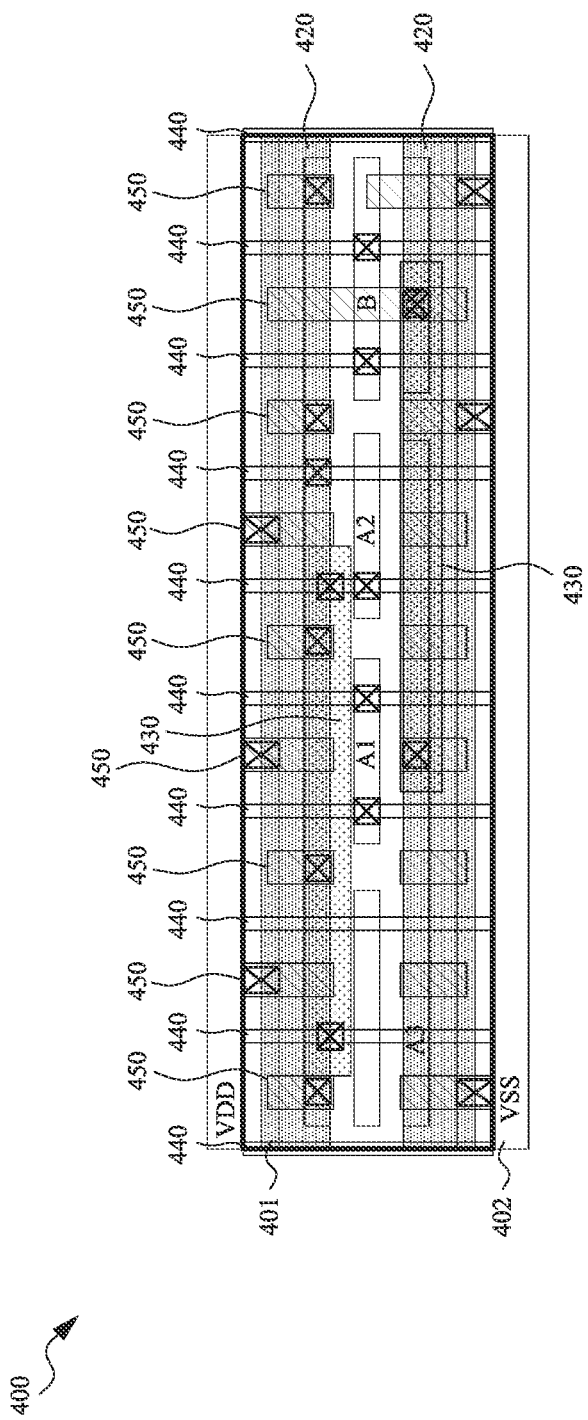
FIG. 4A illustrates a top view of an example circuit layout, in accordance with some embodiments.

Referring now to FIG. 4A, a top view of another example circuit layout 400 is shown, in accordance with some embodiments. Circuit layout 400 may correspond to an AND-OR-INVERTOR, which is shown as a non-limiting example in FIG. 4C. As shown in FIG. 4C, the AND-OR-INVERTOR includes a number of transistors. Each of the transistors is gated by an input signal, A1, A2, A3, and B, and the transistors collectively provide an output signal, ZN. The invertor shown in FIG. 4C can provide the following Boolean function: NOT[(A1 AND A2) OR (B1 AND B2)], in some embodiments. Such input/output signals can be provided through a number of conductive structures, which can be better appreciated in the top view of FIG. 4A. Circuit layout 400 is also similar to semiconductor structure 100 and semiconductor structure 200 in the sense that it includes a plurality of gate-all around transistor structures formed on an isolation structure, and a plurality of buried conductive pads formed within the isolation structure. The buried conductive pads are formed within an isolation structure of circuit layout 400, thereby providing enhanced routing flexibility and the ability to reduce the overall area requirements for circuit layout 400.

In FIG. 4A, a plurality of channel structures 420 and a plurality of gate structures 440 are shown. These structures are similar to channel structures 120 and channel structures 220, and gate structures 140 and gate structures 240 discussed above. Circuit layout 400 is also shown to include a plurality of epitaxial regions 450 formed around channel structures 420, similar to epitaxial regions 110 and epitaxial regions 210 discussed above. Also shown in FIG. 4A is a plurality of buried conductive pads 430 that are electrically coupled to various gate-all around transistor structures of circuit layout 400. Buried conductive pads 430 are similar to buried conductive pads 130 and buried conductive pads 230 discussed above, i.e., formed on the backside of a substrate to realize the circuit layout 400. Circuit layout 400 provides an example implementation of buried conductive pads formed within an isolation structure as described in the present disclosure. Through the use of such buried conductive pads, the central poly pitch of circuit layout 400 can be reduced (when compared to an existing layout that implements FinFET structures). This is because the disclosed buried conductive pads can be more flexibly formed across or between the channel structures that adopt the GAAFET structures, which results in less area needed (e.g., reduced by at least 10%). Also shown in FIG. 4A is a power rail 401 and a ground rail 402. Such power rails are formed on the backside of the substrate, in some embodiments.

Figure 4B:
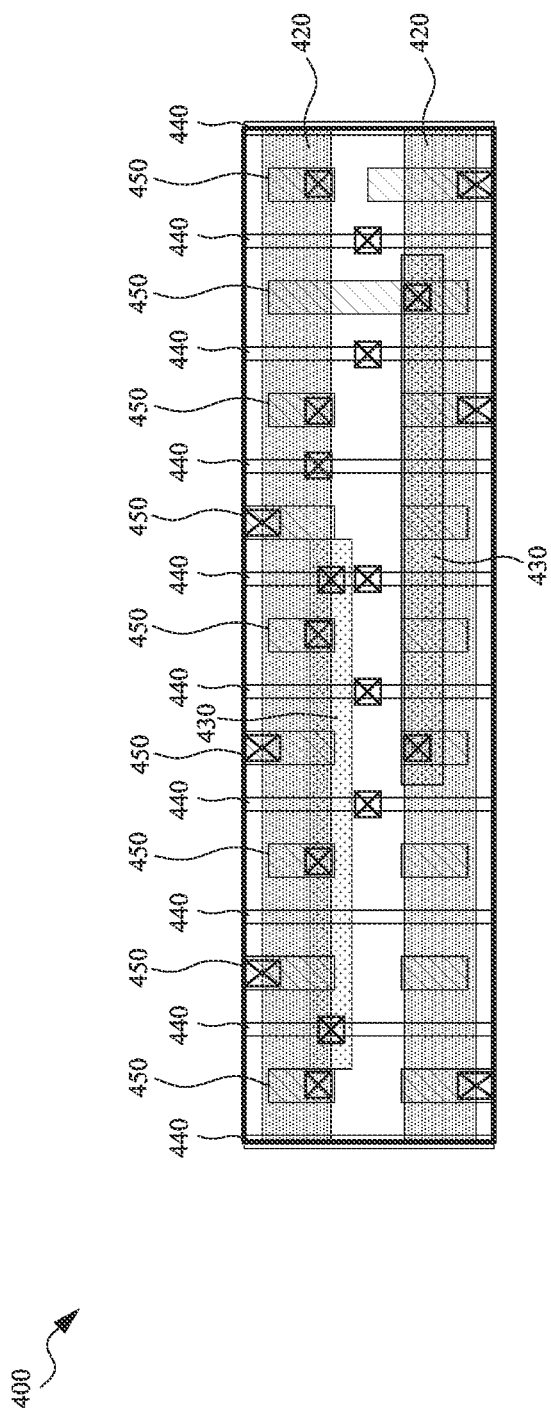
FIG. 4B illustrates a bottom view of the example circuit layout of FIG. 4A, in accordance with some embodiments.
Figure 4C:
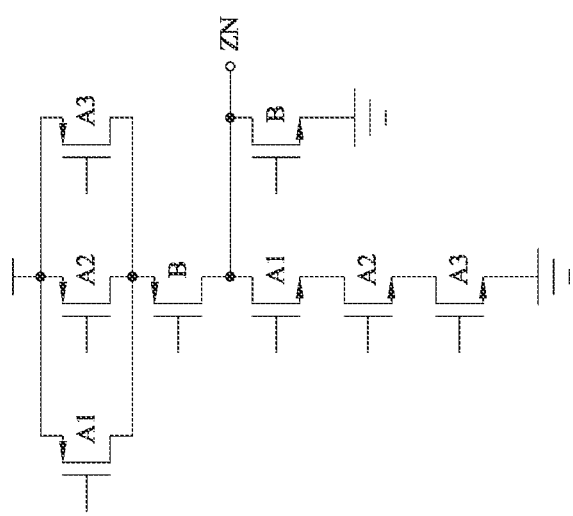
FIG. 4C illustrates an example circuit corresponding to the layouts of FIGS. 4A-B, in accordance with some embodiments.

Referring then to FIG. 4B, a bottom view of circuit layout 400 is shown, in accordance with some embodiments. In FIG. 4B, channel structures 420 can be seen as well as gate structures 440. Further, power rail 401 and ground rail 402 can also be seen, along with buried conductive pads 430. FIG. 4B provides another view of buried conductive pads 430 in order to illustrate the characteristics of buried pads 430.

Figure 5A:
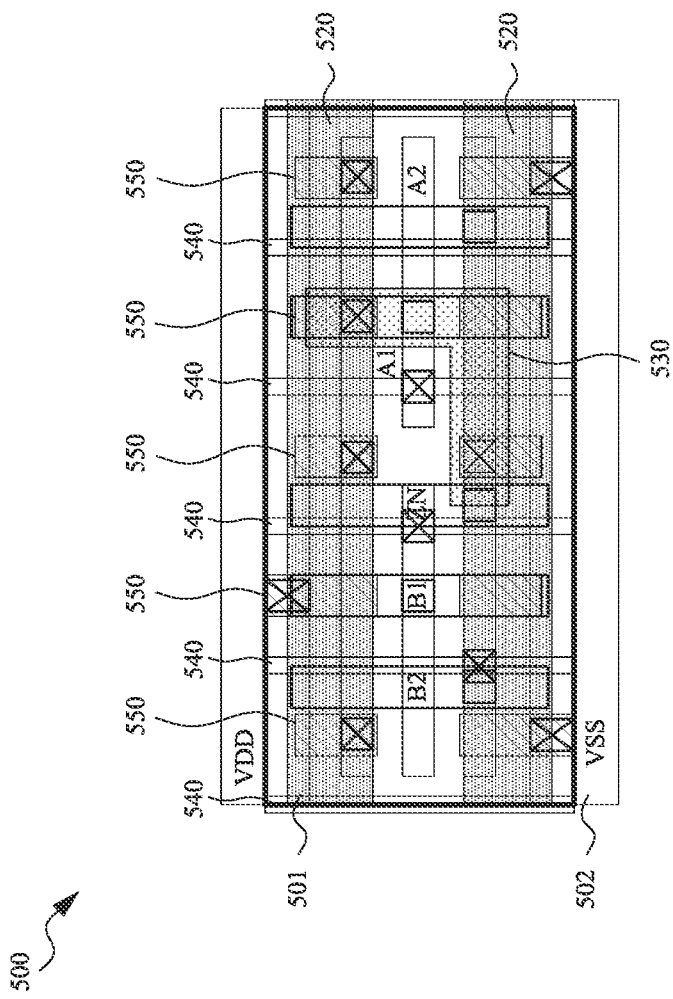
FIG. 5A illustrates a top view of an example circuit layout, in accordance with some embodiments.

Referring now to FIG. 5A, a top view of yet another example circuit layout 500 is shown, in accordance with some embodiments. Circuit layout 500 may correspond to another AND-OR-INVERTOR, which is shown as a non-limiting example in FIG. 5C. As shown in FIG. 5C, the AND-OR-INVERTOR includes a number of transistors. Each of the transistors is gated by an input signal, A1, A2, B1, and B2, and the transistors collectively provide an output signal, ZN. The invertor shown in FIG. 5C can provide the following Boolean function: NOT[(A1 AND A2 AND A3) OR (B)], in some embodiments. Such input/output signals can be provided through a number of conductive structures, which can be better appreciated in the top view of FIG. 5A. Circuit layout 500 is similar to semiconductor structure 100 and semiconductor structure 200 in the sense that it includes a plurality of gate-all around transistor structures formed on an isolation structure, and a buried conductive pad formed within the isolation structure. The buried conductive pad can extend in two dimensions, thereby providing enhanced routing flexibility and the ability to reduce the overall area requirements for circuit layout 500.

In FIG. 5A, a plurality of channel structures 520 and a plurality of gate structures 540 are shown. These structures are similar to channel structures 120 and channel structures 220, and gate structures 140 and gate structures 240 discussed above. Circuit layout 500 is also shown to include a plurality of epitaxial regions 550 formed around channel structures 520, similar to epitaxial regions 110 and epitaxial regions 210 discussed above. Also shown in FIG. 5A is a buried conductive pad 530 that is electrically coupled to various gate-all around transistor structures of circuit layout 500. Buried conductive pad 530 is similar to buried conductive pads 130 and buried conductive pads 230 discussed above, i.e., formed on the backside of a substrate to realize the circuit layout 500. Circuit layout 500 provides an example implementation of a two-dimensional buried conductive pad as described in the present disclosure. Through the use of such a buried conductive pad, the central poly pitch of circuit layout 500 can be reduced (when compared to an existing layout that implements FinFET structures). This is because the disclosed buried conductive pads can be more flexibly formed across or between the channel structures that adopt the GAAFET structures, which results in less area needed. Also shown in FIG. 5A is a power rail 501 and a ground rail 502. Such power rails are formed on the backside of the substrate, in some embodiments.

Figure 5B:
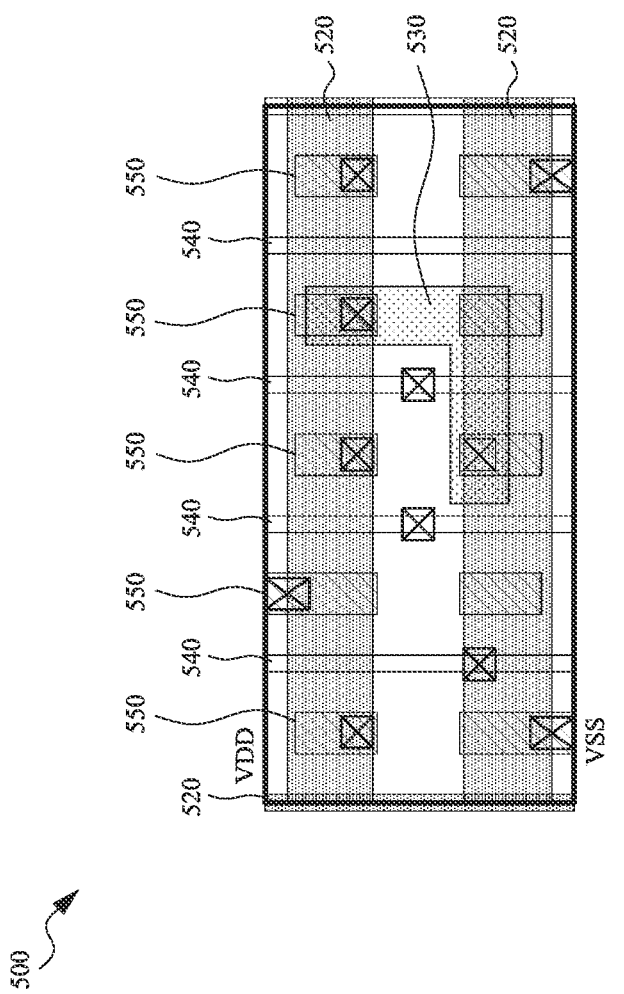
FIG. 5B illustrates a bottom view of the example circuit layout of FIG. 5A, in accordance with some embodiments.
Figure 5C:
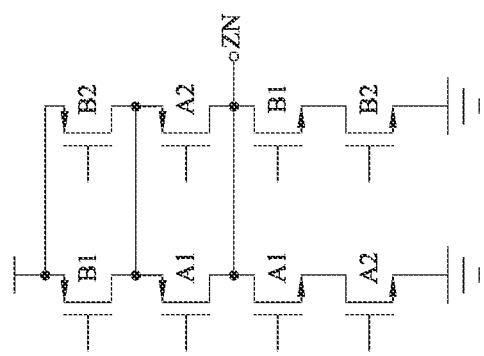
FIG. 5C illustrates an example circuit corresponding to the layouts of FIGS. 5A-B, in accordance with some embodiments.

Referring now to FIG. 5B, a bottom view of circuit layout 500 is shown, in accordance with some embodiments. In FIG. 5B, channel structures 520 can be seen as well as gate structures 540. Further, power rail 501 and ground rail 502 can also be seen, along with buried conductive pad 530. FIG. 5B provides another view of buried conductive pad 530 in order to illustrate the two-dimensional characteristics of buried pad 530. As seen in FIG. 5B, buried conductive pads 530 extend not only in the x-dimension, but they also extend in the y-dimension.

As described in detail above, the present disclosure provides a semiconductor structure such as implemented in an integrated circuit. The semiconductor structure includes a gate-all-around transistor structure that is electrically coupled to a buried conductive pad formed within an isolation structure using a via. The formation of the buried conductive pad within the isolation structure, such as a shallow trench isolation structure formed on a substrate, can provide advantages in terms of routing flexibility when designing a circuit layout.

An implementation of the present disclosure is a semiconductor structure. The semiconductor structure includes an isolation structure formed on a substrate, a gate-all-around transistor structure formed on the isolation structure, a via electrically coupled to a gate terminal of the gate-all-around transistor structure, and a buried conductive pad formed within the isolation structure and electrically coupled to the via.

Another implementation of the present disclosure is a circuit. The circuit includes a shallow trench isolation structure formed on a substrate, a gate structure formed on the shallow trench isolation structure and around a plurality of nanowires, a via electrically coupled to the gate structure; and a buried conductive pad formed within the shallow trench isolation structure and electrically coupled to the via, the buried conductive pad extending in two dimensions within the isolation structure.

Yet another implementation of the present disclosure is another semiconductor structure. The semiconductor structure includes an isolation structure formed on a substrate, a gate structure formed on the isolation structure and around a plurality of nanosheets, a via electrically coupled to the gate structure, and a buried conductive pad formed within the shallow trench isolation structure and electrically coupled to the via, the buried conductive pad extending in both a horizontal dimension and a vertical dimension within the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
an isolation structure formed on a first side of a substrate;
a gate-all-around transistor structure formed on a second side of the substrate, the first side being vertically opposite to the second side;
a via electrically coupled to a gate terminal of the gate-all-around transistor structure, wherein the gate terminal extends along a first lateral direction; and
a buried conductive pad formed on the first side of the substrate within the isolation structure and electrically coupled to the via, wherein the buried conductive pad extends in a direction that is a combination of the first lateral direction and a second lateral direction, and wherein the first lateral direction is perpendicular to the second lateral direction.

2. The semiconductor structure of claim 1, wherein the via comprises a first via and the gate-all-around transistor structure comprises a first gate-all-around transistor structure, the semiconductor structure further comprising a second gate-all-around transistor structure and a second via, wherein the second via is electrically coupled to the buried conductive pad and to a gate terminal of the second gate-all-around transistor structure.

3. The semiconductor structure of claim 1, wherein the via comprises a first via, the semiconductor structure further comprising a second via electrically coupled to a source terminal or a drain terminal of the gate-all-around transistor structure and to the buried conductive pad.

4. The semiconductor structure of claim 1, wherein the gate terminal of the gate-all-around transistor structure is formed around a plurality of nanowires.

5. The semiconductor structure of claim 4, wherein the plurality of nanowires each extend along the second lateral direction.

6. The semiconductor structure of claim 1, wherein the gate terminal of the gate-all-around transistor structure is formed around a plurality of nanosheets.

7. The semiconductor structure of claim 6, wherein the plurality of nanosheets each extend along the second lateral direction.

8. A circuit, comprising:
a shallow trench isolation structure formed on a first side of a substrate;
a gate structure formed on a second, opposite side of the substrate and wrapping around a plurality of nanowires, wherein the gate structure extends along a first lateral direction and the plurality of nanowires each extend along a second lateral direction, wherein the first lateral direction is perpendicular to the second lateral direction;
a via electrically coupled to the gate structure; and
a buried conductive pad formed on the first side of the substrate within the shallow trench isolation structure and electrically coupled to the via, the buried conductive pad extending in a direction that is a combination of the first lateral direction and the second lateral direction.

9. The circuit of claim 8, wherein the gate structure is formed using polysilicon material and is a gate terminal of a gate-all-around transistor structure.

10. The circuit of claim 8, wherein the via comprises a first via and the gate structure comprises a first gate structure, the circuit further comprising a second via electrically coupled to the buried conductive pad and electrically coupled to a second gate structure.

11. The circuit of claim 10, further comprising a third via electrically coupled to an epitaxial region and electrically coupled to the buried conductive pad.

12. The circuit of claim 8, wherein the via comprises a first via, the circuit further comprising a second via electrically coupled to an epitaxial region and electrically coupled to the buried conductive pad.

13. The circuit of claim 8, wherein the buried conductive pad further extends in a vertical direction within the isolation structure.

14. The circuit of claim 8, wherein the buried conductive pad comprises a first section and a second section, the first section extending in the direction and the second section extending in one of the first lateral direction or the second lateral direction.

15. A semiconductor structure, comprising:
an isolation structure formed on a first side of a substrate;
a gate structure formed on a second, opposite side of the substrate and wrapping around a plurality of nanosheets, wherein the gate structure extends along a first lateral direction and the plurality of nanosheets each extend along a second lateral direction, wherein the first lateral direction is perpendicular to the second lateral direction;
a via electrically coupled to the gate structure; and
a buried conductive pad formed on the first side of the substrate within the shallow trench isolation structure and electrically coupled to the via, the buried conductive pad extending in a direction that is a combination of the first lateral direction and the second lateral direction.

16. The semiconductor structure of claim 15, wherein the gate structure is formed using polysilicon material and is a gate terminal of a gate-all-around transistor structure.

17. The semiconductor structure of claim 16, wherein the via comprises a first via, the semiconductor structure further comprising a second via electrically coupled to a source terminal or a drain terminal of the gate-all-around transistor structure and to the buried conductive pad.

18. The semiconductor structure of claim 15, wherein the via comprises a first via and the gate structure comprises a first gate structure, the circuit further comprising a second via electrically coupled to the buried conductive pad and electrically coupled to a second gate structure.

19. The semiconductor structure of claim 18, further comprising a third via electrically coupled to an epitaxial region and electrically coupled to the buried conductive pad.

20. The semiconductor structure of claim 15, wherein the via comprises a first via, the semiconductor structure further comprising a second via electrically coupled to an epitaxial region and electrically coupled to the buried conductive pad.

* * * * *